(12) United States Patent
Park et al.

(10) Patent No.: US 12,419,183 B2
(45) Date of Patent: Sep. 16, 2025

(54) VIEWING ANGLE CONTROLLING FILM AND DISPLAY DEVICE COMPRISING THE SAME

(71) Applicant: LG DISPLAY CO., LTD., Seoul (KR)

(72) Inventors: Jaehyun Park, Seongnam-si (KR); Sunghee Kim, Paju-si (KR); Sujeong Lee, Seoul (KR)

(73) Assignee: LG Display Co., Ltd (KR)

( * ) Notice: Subject to any disclaimer, the term of this patent is extended or adjusted under 35 U.S.C. 154(b) by 571 days.

(21) Appl. No.: 17/866,057

(22) Filed: Jul. 15, 2022

(65) Prior Publication Data

US 2023/0100884 A1 Mar. 30, 2023

(30) Foreign Application Priority Data

Aug. 26, 2021 (KR) .................. 10-2021-0113243

(51) Int. Cl.
*G02F 1/167* (2019.01)
*G02F 1/13* (2006.01)
(Continued)

(52) U.S. Cl.
CPC ............ *G02F 1/167* (2013.01); *G02F 1/1323* (2013.01); *G02F 1/1676* (2019.01);
(Continued)

(58) Field of Classification Search
CPC ...... G02F 1/167; G02F 1/1323; G02F 1/1676; G02F 1/1685; G02F 2001/1678; G02F 2202/36; G02F 1/133512; H10K 50/865; H10K 59/12; H10K 59/875; H10K 59/8792; H10K 50/85; G02B 5/223
See application file for complete search history.

(56) References Cited

U.S. PATENT DOCUMENTS 11,448,908 B1 * 9/2022 Fan Jiang ......... G02F 1/133526
2022/0187673 A1 * 6/2022 Park ...................... G02F 1/137
(Continued)

FOREIGN PATENT DOCUMENTS

CN 101782707 A 7/2010
KR 20120052760 A 5/2012
(Continued)

OTHER PUBLICATIONS

Office Action in Chinese Appln. No. 2022108210801, mailed on Apr. 23, 2025, 15 pages (with English translation).
Office Action in Korean Appln. No. 20210113243, mailed on Feb. 3, 2025, 18 pages (with English translation).

*Primary Examiner* — Charles S Chang
(74) *Attorney, Agent, or Firm* — Fish & Richardson P.C.

(57) ABSTRACT

A viewing angle controlling film for a display device includes a first base member, a first electrode disposed on the first base member; a transparent resin layer which is disposed on the first electrode and has a plurality of accommodating units; a second electrode disposed on the transparent resin layer; and a second base member disposed on the second electrode, and in which an ink including charged black particles, charged high refractive particles, and a solvent is accommodated in each of the plurality of accommodating units and the charged black particles are charged with a charge opposite to the charged high refractive particles.

18 Claims, 11 Drawing Sheets

(51) Int. Cl.
  *G02F 1/1675*   (2019.01)
  *G02F 1/1676*   (2019.01)
  *G02F 1/1685*   (2019.01)
  H10K 50/86   (2023.01)
  H10K 59/12   (2023.01)
(52) U.S. Cl.
  CPC .... *G02F 1/1685* (2019.01); *G02F 2001/1678* (2013.01); *G02F 2202/36* (2013.01); *H10K 50/865* (2023.02); *H10K 59/12* (2023.02)

(56) References Cited

U.S. PATENT DOCUMENTS

| | | | |
|---|---|---|---|
| 2022/0291564 A1* | 9/2022 | Han | G02F 1/1679 |
| 2023/0152658 A1* | 5/2023 | Hong | G02B 26/08 |
| | | | 359/296 |
| 2023/0324759 A1* | 10/2023 | Son | H10K 59/50 |
| | | | 359/296 |

FOREIGN PATENT DOCUMENTS

| | | |
|---|---|---|
| KR | 20120109479 A | 10/2012 |
| KR | 10-2013-0110337 A | 10/2013 |
| KR | 20210041867 A | 4/2021 |
| KR | 20210042627 A | 4/2021 |
| KR | 20210043155 A | 4/2021 |
| WO | WO 2021/060750 A1 | 4/2021 |

* cited by examiner

VIEWING ANGLE CONTROLLING FILM AND DISPLAY DEVICE COMPRISING THE SAME

CROSS-REFERENCE TO RELATED APPLICATION

This application claims the priority of Korean Patent Application No. 10-2021-0113243 filed on Aug. 26, 2021, which is hereby incorporated by reference in its entirety.

BACKGROUND

Field of the Disclosure

The present disclosure relates to a viewing angle controlling film and a display device including the same, and more particularly, to a viewing angle controlling film which has a high switching speed of a wide viewing angle mode and a narrow viewing angle mode and excellent driving characteristic, and improves a mura phenomenon (i.e., irregularities and clouding effects seen on a display screen) and a display device including the same.

Description of the Background

In accordance with the increased demand for personal privacy protection, various related products are being developed in various fields. Among products that guarantee the personal privacy, a demand for a viewing angle control device which is attached to various displays such as a cellular phone, a tablet PC, a monitor, or a display for a vehicle to block lateral light transmission and narrows a viewing angle is increasing year by year.

With regard to this, in the related art, a film type viewing angle controlling film in which a light transmissive area through which light is transmitted and a light blocking area which blocks light in a specific direction are alternately formed has been used. The viewing angle controlling film of the related art includes a transmissive area and a light blocking area which is disposed between the transmissive areas to block or absorb the light. The light blocking area includes a black pigment. Light having an incident angle which is equal to or larger than a predetermined angle, among light incident from the lower portion, is absorbed or blocked by light blocking areas which are repeatedly formed so that the light cannot pass through the viewing angle controlling film. By doing this, at a viewing angle which is equal to or larger than a predetermined angle, light transmittance is significantly reduced so that the screen is not visible. However, the viewing angle controlling film of the related art has inconvenience in that if the film is not removed, the viewing angle is not restored to the existing state so that the film needs to be removed.

Recently, in order to solve this inconvenience, a viewing angle controlling film which selectively switches a wide viewing angle mode and a narrow viewing angle mode according to an electrical signal applied from the outside without attaching/detaching the film is being developed.

In the meantime, the switchable viewing angle controlling film of the related art has a problem of the ghost mura phenomenon in which the screen looks overlapped due to the difference in refractive indexes between the transparent resin and the ink which configure the film.

SUMMARY

Accordingly, the present disclosure is to provide a viewing angle controlling film in which the ghost mura phenomenon is improved by reducing the difference in refractive index between the transparent resin and the ink while maintaining the luminance and the driving characteristic to be high.

The present disclosure is also to provide a viewing angle controlling film in which the particle settling in an ink is improved and a switching speed of a wide viewing angle mode and a narrow viewing angle mode is excellent.

The present disclosure is not limited to the above-mentioned and other features, which are not mentioned above, can be clearly understood by those skilled in the art from the following descriptions.

According to an aspect of the present disclosure, a viewing angle controlling film includes a first base member, a first electrode disposed on the first base member; a transparent resin layer which is disposed on the first electrode and has a plurality of accommodating units; a second electrode disposed on the transparent resin layer; and a second base member disposed on the second electrode, and in which an ink including charged black particles, charged high refractive particles, and a solvent is accommodated in each of the plurality of accommodating units and the charged black particles are charged with a charge opposite to the charged high refractive particles.

According to another aspect of the present disclosure, a display device includes a display panel; and a viewing angle controlling film which is disposed above or below the display panel.

Other detailed matters of the exemplary aspects are included in the detailed description and the drawings.

According to the present disclosure, in the viewing angle controlling film, an ink including charged black particles, charged high-refractive particles, and a solvent is accommodated in each of a plurality of accommodating unit. Therefore, the viewing angle controlling film of the present disclosure reduces the difference in the refractive indexes between the ink and the transparent resin layer to improve the ghost mura phenomenon.

Further, the viewing angle controlling film of the present disclosure uses an ink including charged black particles and charged high-refractive particles to improve the particle settling due to the gravity, thereby improving the driving characteristic.

Further, the viewing angle controlling film and the display device including the viewing angle controlling film according to the present disclosure have an excellent switching speed of the wide viewing angle mode and the narrow viewing angle mode and an excellent driving performance.

The effects according to the present disclosure are not limited to the contents exemplified above, and more various effects are included in the present specification.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
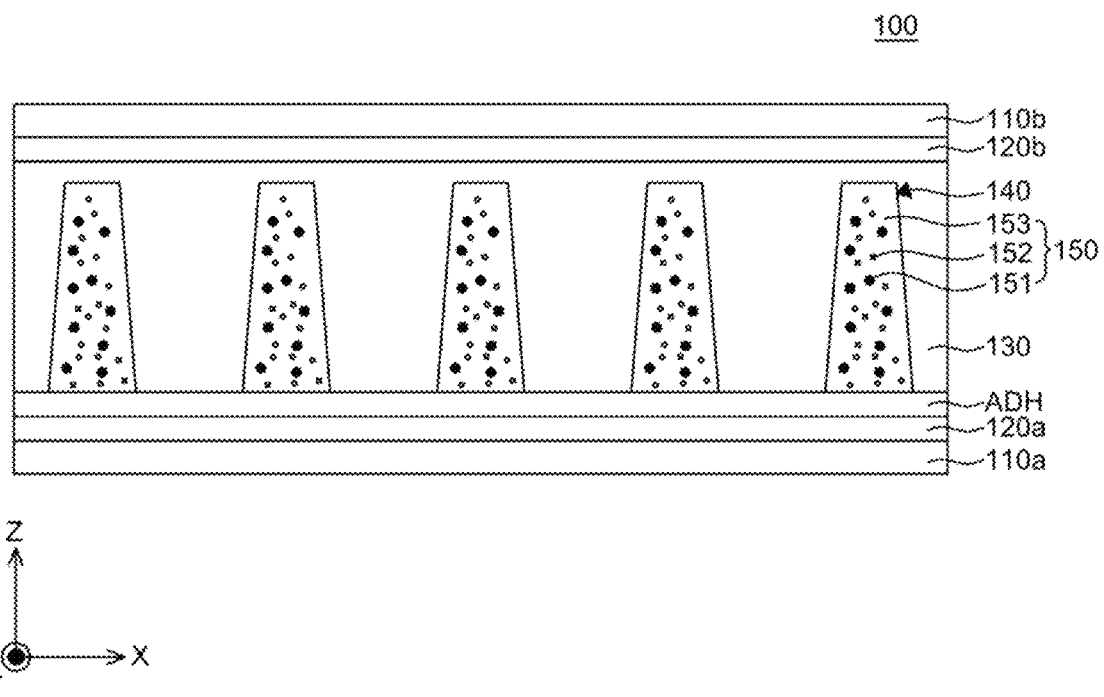
FIG. 1 is a schematic cross-sectional view of a viewing angle controlling film according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Unless otherwise stated herein, an average particle size refers to a particle size D50 corresponding to 50% in a cumulative particle size distribution measured at 20° C. to 25° C. using Nano ZS ZEN3600 of Malvern Panalytical Ltd.

Unless otherwise stated herein, a charge quantity refers to a zeta potential value measured at 20° C. to 25° C. using Nano ZS ZEN3600 of Malvern Panalytical Ltd.

Hereinafter, a viewing angle controlling film and a display device according to exemplary aspects of the present disclosure will be described in detail with reference to accompanying drawings.

Figure 2:
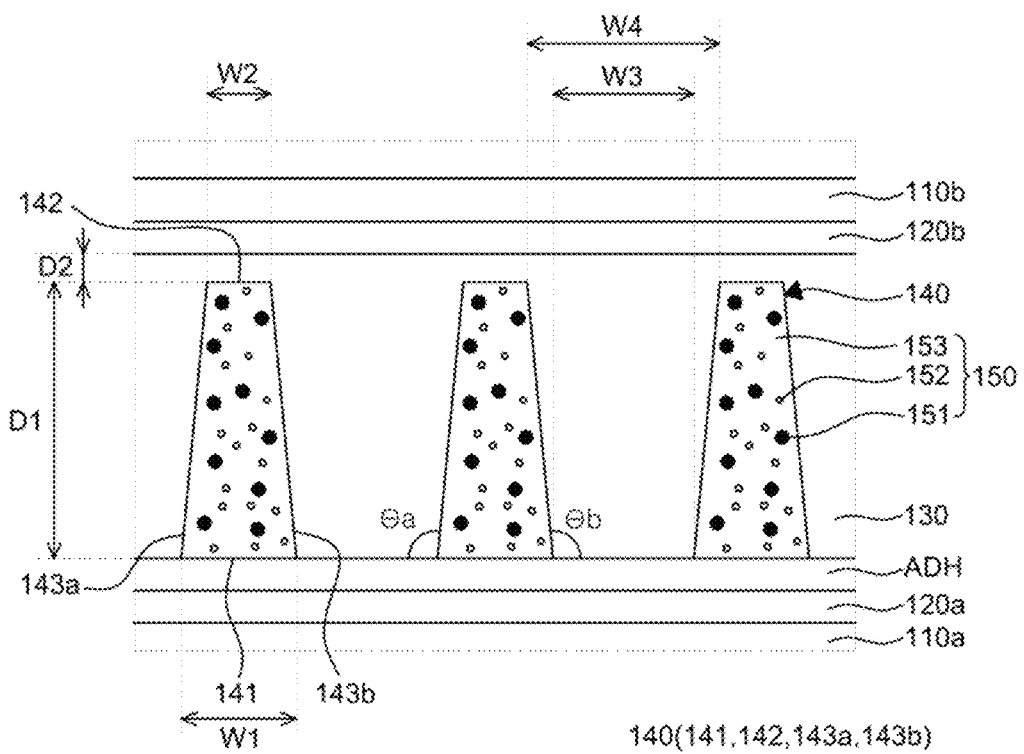
FIG. 2 is an enlarged view of a viewing angle controlling film according to an exemplary aspect of the present disclosure.

FIG. 1 is a schematic cross-sectional view of a viewing angle controlling film according to an exemplary aspect of the present disclosure. FIG. 2 is an enlarged view of a viewing angle controlling film according to an exemplary aspect of the present disclosure.

The viewing angle controlling film according to the exemplary aspect of the present disclosure is applied to the organic light emitting display device or the liquid crystal display device. When an electric field is not formed, the viewing angle controlling film operates in a wide viewing angle mode to transmit light incident from the lower portion at various angles so that an image displayed on the display device is observed not only from the front surface, but also from the side surface. In contrast, when the electric field is not formed, the viewing angle controlling film absorbs light having an incident angle which is equal to or larger than a predetermined angle, among light incident from the lower portion. Accordingly, the viewing angle controlling film operates in a narrow viewing angle mode to allow the user to view an image displayed on the display device from the front surface of the display device or only within a specific narrow angle range.

First, referring to FIGS. 1 and 2, a viewing angle controlling film 100 according to an exemplary aspect of the present disclosure includes a first base member 110a, a first electrode 120a, an adhesive layer ADH, a transparent resin layer 130, a plurality of accommodating units 140, an ink 150, a second electrode 120b, and a second base member 110b.

The first base member 110a protects the first electrode 120a and the transparent resin layer 130. The first base member 110a may be formed of a transparent insulating material. For example, the first base member 110a may be formed to include one or more polymers selected from polycarbonate, polyethylene terephthalate, polyimide, cycloolefin polymer, cycloolefin copolymer and triacetyl cellulose.

For example, a thickness of the first base member 110a may be 10 μm to 50 μm, but is not limited thereto.

The first electrode 120a is disposed on the first base member 110a. The first electrode 120a may be formed of a transparent conductive material to transmit light incident from the lower portion. For example, the transparent conductive material may be one or more selected from indium-tin-oxide (ITO), indium-zinc-oxide (IZO), indium-tin-zinc oxide (ITZO), and aluminum zinc oxide (AZO), but is not limited thereto.

The first electrode 120a may be formed on a front surface of the first base member 110a and if necessary, may be selectively patterned to overlap the plurality of accommodating units 140.

For example, a thickness of the first electrode 120a may be 5 μm to 30 μm, but is not limited thereto.

The transparent resin layer 130 is disposed on the first electrode 120a. The transparent resin layer 130 may be formed of a transparent insulating resin which transmits light incident from the lower portion of the viewing angle controlling film 100. For example, the transparent resin layer 130 may include one or more selected from an acrylic resin, polycarbonate, polyethylene terephthalate, triacetyl cellulose resin, polyethylene, and polypropylene.

For example, the transparent resin layer 130 may include an acrylic resin, and desirably may be an acrylic resin formed by curing a urethane acrylate compound. The acrylic resin formed from a urethane acrylate compound has advantages of excellent curability, high transparency, and excellent adhesion property. Specifically, for example, the transparent resin layer 130 may be formed by photopolymerizing the resin composition including 85 wt % to 95 wt % of a urethane acrylate compound, 1 wt % to 5 wt % of a photoinitiator, 1 wt % to 5 wt % of a surfactant, and 1 wt % to 5 wt % of a release agent.

In order to increase the curing rate and improve a physical property such as adhesiveness, a mixture of a low molecular weight urethane acrylate compound and a high molecular weight urethane acrylate compound may be used. For example, the transparent resin layer may use the mixture of 25 wt % to 75 wt % of the low molecular weight urethane acrylate compound and 25 wt % to 75 wt % of the high molecular weight urethane acrylate compound based on a total weight of the urethane acrylate compound.

For example, a number average molecular weight of the low molecular weight urethane acrylate compound may be less than 1000 g/mol or 100 g/mol or more or less than 1000 g/mol. Further, a number average molecular weight of the high molecular weight urethane acrylate compound may be 10000 g/mol or higher or 10000 g/mol to 100000 g/mol, but is not limited thereto.

If the photo initiator is generally used to manufacture a transparent resin in the art, the photo initiator is not specifically limited. For example, as the photo initiator, diphenyl (2, 4, 6-trimethylbenzoyl) phosphine oxide or acyl phosphine oxide may be used, but is not limited thereto.

The transparent resin layer 130 may further include a surfactant. For example, the surfactant may be ionic phosphate. As another example, the surfactant may be one or more selected from tricresyl phosphate and tributyl phosphate. In order to drive the viewing angle controlling film 100, an electric field needs to be formed by applying a voltage to the first electrode 120a and the second electrode 120b so that the surfactant is dispersed in the transparent resin layer 130 to easily form the electric field.

The transparent resin layer 130 may further include a release agent. The transparent resin layer 130 includes a plurality of accommodating units 140 which is formed by a processing method such as a master molding process, an imprinting process, or a photolithography process. The release agent may easily separate a structure for forming a pattern such as a mold for forming the plurality of accommodating units 140 from the transparent resin layer 130. For example, the release agent uses a silicon based, polyethylene based, or paraffin-based material which is generated used in the art without degrading the transparency.

For example, a thickness of the transparent resin layer 130 may be 120 μm to 200 μm, but is not limited thereto.

The transparent resin layer 130 includes a plurality of accommodating units 140. Each of the plurality of accommodating units 140 is a space for accommodating the ink 150 which absorbs light incident onto the transparent resin layer 130. The plurality of accommodating units 140 is grooves formed in the transparent resin layer 130 and is formed on the first electrode 120a so as to be opposite to the second electrode 120b.

Each of the plurality of accommodating units 140 is disposed to be spaced apart from each other with a predetermined interval along a first direction (an x axis direction) which is perpendicular to a thickness direction (a z axis direction) of the transparent resin layer 130.

Each of the plurality of accommodating units 140 extends along the second direction (y axis direction) which is perpendicular to the thickness direction (a z axis direction) and the first direction (an x axis direction). That is, each of the plurality of accommodating units 140 extends from any one corner of the first electrode 120a to the other corner which is parallel the one corner to be formed on the first electrode 120a with a stripe structure.

Each of the plurality of accommodating units 140 is configured by a lower surface 141, an upper surface 142, a first connection unit 143a, and a second connection unit 143b. Specifically, each of the plurality of accommodating units 140 includes the lower surface 141 opposite to the first electrode 120a and the upper surface 142 opposite to the lower surface 141. Further, each of the plurality of accommodating units 140 includes the first connection unit 143a which connects one end of the lower surface 141 and one end of the upper surface 142 corresponding thereto and the second connection unit 143b which connects the other end of the lower surface 141 and the other end of the upper surface 142 corresponding thereto.

Each of the plurality of accommodating units 140 may be formed such that a width is reduced from the first electrode 120a toward the second electrode 120b. That is, a width W1 of the lower surface 141 of each of the plurality of accommodating units 140 is larger than a width W2 of the upper surface 142. In this case, in the wide viewing angle mode, a wider viewing angle may be provided. In the drawings, even though it is illustrated that a cross-sectional shape of each of the plurality of accommodating units 140 has a trapezoidal shape, it is just an example, but is not limited thereto.

The upper surface 142 of each of the plurality of accommodating unit 140 is formed to be spaced apart from the second electrode 120b. That is, each of the plurality of accommodating units 140 does not pass through the transparent resin layer 130 in the thickness direction (a z axis direction) of the transparent resin layer 130. When the plurality of accommodating units 140 is formed to have a hole structure which passes through the transparent resin layer 130, if a liquid ink 150 is filled in the accommodating unit 140, a problem such as leakage is not caused so that the productivity is excellent. Therefore, the upper surface 142 of the plurality of accommodating units 140 is spaced apart from the second electrode 120b so as not to be in contact and the transparent resin layer 130 is present in the space therebetween. However, it is not limited thereto and if necessary, the plurality of accommodating units 140 may be formed to completely pass through the transparent resin layer 130 in the thickness direction (the Z axis direction) of the transparent resin layer 130.

The ink 150 includes charged black particles 151, charged high refractive particles 152, and a solvent 153. The charged black particles 151 which are photo-absorptive materials absorb light incident onto the transparent resin layer 130. The charged high refractive particles 152 increases a refractive index of the ink 150 to reduce the difference in the refractive indexes of the transparent resin layer 130 and the ink 150. The solvent 153 disperses the charged black particles 151 and the charged high refractive particles 152 which are solid powders in the plurality of accommodating units 140 without being settled.

For example, the solvent 153 may be one or more selected from halocarbon solvents, isoparaffinic solvents, and ether solvents.

For example, the halocarbon solvent may be a fully or partially halogenated hydrocarbon. For example, the halocarbon solvent may include one or more selected from halocarbon 0.8, halocarbon 1.8, halocarbon 4.2 and halocarbon 6.3 of Halocarbon LLC. FC-72, FC-74, and FC-70 of 3M, FCL 1031 of Milo, and HT55 of Solvay.

For example, the isoparaffinic solvent may include one or more selected from Isopar G, Isopar L, Isopar C, Isopar E, Isopar M, and Isopar H of ExxonMobil Corporation, but is not limited thereto.

For example, the ether solvent may include one or more selected from diethylene glycol dimethyl ether, propylene glycol methyl ether, and propylene glycol methyl ether acetate, but is not limited thereto.

The solvent 153 has a different density and dielectric constant depending on the type and is appropriately selected in accordance with a demanded characteristic. Further, the solvent 153 uses a single material and if necessary, two or more materials may be mixed to control the density or the dielectric permittivity of the ink 150.

Further, as the solvent 153, a solvent having an ignition point of 60 degrees or lower may be desirably used in consideration of the process stability.

In the meantime, it is desirable to use the solvent 153 after removing moisture using a moisture remover. The moisture in the solvent 153 promotes aggregation between particles so that the viscosity of the ink 150 is increased. When the viscosity of the ink 150 is increased, a mobility of charged black particles 151 is lowered so that the driving characteristic is degraded and a switching speed of the wide viewing angle mode and the narrow viewing angle mode may be lowered. Therefore, it is desirable to use a moisture remover which is generally used in the art such as zeolite, magnesium hydroxide, and porous silica to remove as much moisture in the solvent 153 as possible.

The charged black particles 151 are formed by photo-absorptive materials so that the charged black particles absorb light incident onto the transparent resin layer 130. For example, the charged black particles 151 may be one or more types of black particles selected from a carbon nano tube and a carbon black which are chemically stable and have excellent photo-absorptivity.

The charged black particles 151 may have a porous or non-porous structure. The charged black particles 151 need to maintain a stably dispersed state in the ink 150 without being settled by the gravity. Therefore, it is desirable that the charged black particles 151 have a density which is substantially equal to that of the solvent 153. When the solvent 153 having a low density is used, the density between the solvent 153 and the charged black particles 151 may be controlled to be equal using porous black particles having a relatively low density. Further, the charged black particles 151 may have a hollow structure. When the charged black particles have a hollow structure, the density is lower than that of the particle which does not have a hollow structure. Accordingly, when the solvent 153 having a low density is used, the density difference between the solvent 153 and the charged black particles 151 may be reduced using black particles having a hollow structure. Accordingly, the charged black particles 151 are not settled due to the gravity, but maintains a stably dispersed state in the ink 150.

For example, the average particle size of the charged black particles 151 may be 50 nm to 500 nm or 100 nm to 250 nm. Within this range, the dispersion stability is excellent and the charge quantity of the charged black particles 151 is high so that the driving characteristic is excellent. When the average particle size is too small, aggregation between particles is caused due to the interaction between particles and the dispersion stability of the charged hollow carbon black 151 is degraded. When the average particle size of the charged black particles is too large, there may be a problem in that the charged black particles 151 are settled in the ink 150 due to the gravity. When the average particle size of the charged black particles 151 is too large, the charge quantity of the particles is lowered so that the switching speed of the wide viewing angle mode and the narrow viewing angle mode may be slowed.

The charged black particles 151 are charged with a positive charge or a negative charge. Accordingly, when a voltage is applied to the first electrode 120a and the second electrode 120b, the charged black particles 151 which are uniformly dispersed in the solvent 153 are aggregated in the vicinity of the first electrode 120a or the second electrode 120b by an electric field formed therebetween. A detailed description thereof will be provided below.

For example, the charged black particles 151 are charged with the negative charge. Specifically, the charged black particles 151 which are charged with negative charges may be black particles which is surface-modified with one or more functional groups selected from a carboxylate group (—COO—), sulfonate group (—SO3-) and sulfate group (SO42-). For example, the black particles modified with the carboxylate group are obtained by a simple process of adding the black particles into the nitric acid and/or sulfuric acid, reacting the black particles at a relatively low temperature of approximately 100° C., and then dispersing the black particles in the solvent 153. The charged black particles 151 obtained as described above have a high surface charge quantity. The charged black particles 151 have a high surface charge quantity to be more quickly moved by the electric field and thus the bistability is improved and the driving characteristic and the stability of the viewing angle controlling film 100 may be improved.

For example, the charged black particles 151 are included in an amount of 0.1 wt. % to 3.5 wt. % based on a total weight of the ink 150. When the content of the charged black particles 151 is too small, the photo absorption effect may be degraded. When the content of the charged black particles 151 is too large, there is a problem in that if the viewing angle controlling film 100 is applied to the display device, the luminance is degraded.

A refractive index of the ink 150 including the photo absorptive material is lower than a refractive index of the transparent resin layer 130. A multiple-image phenomenon, that is, a ghost mura phenomenon in which a plurality of images overlaps may be generated due to the difference in the refractive indexes between the ink 150 and the transparent resin layer 130 as described above. The charged high refractive particles 152 are dispersed in the ink 150 having a lower refractive index to reduce the difference in the refractive indexes between the ink 150 and the transparent resin layer 130. Further, when the charged high refractive index particles are added, the particle settling in the ink may be suppressed. By doing this, the settling of the particles in the ink due to the gravity may be minimized.

For example, the charged high refractive particles 152 may be high refractive particles including one or more selected from titanium dioxide, zirconium dioxide, and zinc oxide. Such high refractive particles have a high refractive index to reduce the difference in the refractive indexes of the ink 150 and the transparent resin layer 130. By doing this, the ghost mura phenomenon may be minimized. Desirably, for example, the high refractive particles may be zinc oxide. Zink oxide has the most excellent optical property so that when the viewing angle controlling film 100 is applied to the display device, the ghost mura phenomenon may be minimized while maintaining the luminance to be high.

For example, the refractive index of the high refractive particle may be 1.7 to 3 or 1.8 to 2.1. Within this range, the refractive index difference between the ink 150 and the transparent resin layer 130 is reduced while maintaining the transparency of the viewing angle controlling film 100 to be high to minimize image distortion such as ghost mura. Specifically, when within the range of the refractive index of the high refractive particle of 1.8 to 2.1, the viewing angle controlling film 100 is applied to the display device, a higher luminance may be implemented.

The charged high refractive particles 152 are charged with a positive charge or a negative charge. When the high refractive particles are charged, the high refractive particles do not aggregated due to the repulsion between particles due to the surface charge, but maintain a uniformly dispersed state in the ink 150. Therefore, when the viewing angle controlling film 100 is applied to the display device, the mura phenomenon may be minimized while maintaining a high luminance. When the high refractive particles are not charged, the aggregation between particles is easily caused so that the reflective haze of the viewing angle controlling film 100 is increased and the photo transmittance is degraded.

The charged high refractive particles 152 are charged with electric charges which are opposite to those of the charged black particles 151. As described above, when a voltage is applied to the first electrode 120a and the second electrode 120b, the charged black particles 151 are aggregated in the vicinity of the first electrode 120a or the second electrode 120b by an electric field formed therebetween. At this time, when the high refractive particles 152 charged by the electric field move to the same electrode as the charged black particles 151, the movement speed of the charged black particles 151 is degraded, which affects the driving performance. Accordingly, the charged high refractive particles 152 and the charged black particles 151 are charged with opposite electric charges so as not to allow the charged high refractive particles 152 to move toward the same electrode as the charged black particles 151 when the electric field is formed.

For example, the charged high refractive particles 152 are charged with the positive charge. For example, the charged high refractive particles 152 may be high refractive particles which are surface-modified with ammonium group. Specifically, the charged high refractive particles 152 may be high refractive particles surface-modified with a quaternary ammonium group selected from a cetyltrimethylammonium group, a tetradecyltrimethylammonium group, an octyltrimethylammonium group, and a dodecyltrimethylammonium group. In this case, the charged high refractive particles 152 are uniformly dispersed in the ink 150 and the ghost mura phenomenon may be suppressed without degrading the optical characteristic of the viewing angle controlling film 100.

For example, the average particle size of the charged high refractive particles 152 may be 5 nm to 30 nm or 8 nm to 15 nm. Within this range, there are advantages in that the reflective haze of the viewing angle controlling film 100 is low, the light transmittance is high, and the driving characteristic is excellent. The charged high refractive particles 152 should be maintained in a uniformly dispersed state in the ink 150, regardless of whether the electric field is formed, to reduce the refractive index difference between the ink 150 and the transparent resin layer 130.

When the average particle size of the charged high refractive particles 152 is too small, the charged high refractive particles 152 may not be uniformly dispersed in the ink 150 due to the interaction between particles, but may be aggregated. Further, as the particle size is decreased, the zeta potential is increased to a positive value. Accordingly, when the voltage is applied to the first electrode 120a and the second electrode 120b, the charged high refractive particles 152 are not uniformly dispersed, but may be aggregated in the vicinity of the electrode applied with a negative voltage. Accordingly, the ghost mura phenomenon may not be improved.

Further, when the average particle size of the charged high refractive particles 152 is too large, light incident onto the transparent resin layer 130 is scattered so that the reflective haze of the viewing angle controlling film 100 is increased and the photo transmittance is degraded. When the average particle size of the charged high refractive particles 152 is too large, the viscosity of the ink 150 is increased, so that the mobility of the charged black particles 151 may be degraded. Accordingly, the driving characteristic and the mode switching speed of the viewing angle controlling film 100 may be degraded. Further, as the average particle size of the charged high refractive particles 152 is increased, the zeta potential is increased to the negative value. Accordingly, when the voltage is applied to the first electrode 120a and the second electrode 120b, the charged high refractive particles 152 are not uniformly dispersed, but may be aggregated in the vicinity of the electrode applied with a positive voltage. Accordingly, the ghost mura phenomenon may not be improved.

For example, the charged high refractive particles 152 are included in an amount of 0.1 wt % to 4 wt % based on a total weight of the ink 150. When the content of the charged high refractive particles 152 is within the above-mentioned range, the difference in refractive index between the ink 150 and the transparent resin layer 130 is reduced to improve the ghost mura phenomenon. The refractive index of the transparent resin layer 130 is larger than the refractive index of the ink 150 and the charged high refractive particles 152 are added in the ink 150 with a predetermined content or more so that the difference in refractive index between the ink 150 and the transparent resin layer 130 is reduced. When the content of the charged high refractive particles 152 is too small, an increased amount of the refractive index of the ink 150 is not so large so that the effect of improving the mura phenomenon is insignificant. Further, when the content of the charged high refractive particles 152 is excessive, the haze of the viewing angle controlling film 100 may be increased. By doing this, when the viewing angle controlling film 100 is applied to the display device, the luminance may be degraded. Further, as the solid content in the ink 150 is increased, the viscosity of the ink 150 is increased so that the switching speed of the wide viewing angle mode and the narrow viewing angle mode may be slowed. Further, as the content of the charged high refractive particles 152 is increased, the refractive index of the ink 150 is increased. when the content is too much, the refractive index of the ink 150 is larger than the refractive index of the transparent resin layer 130. Accordingly, the refractive index difference between the ink 150 and the transparent resin layer 130 is increased so that the ghost mura phenomenon may not be improved.

However, the content range of the charged high refractive particles 152 may vary depending on a type of the high refractive particles. The refractive index vary depending on the type of the high refractive particles so that the content range may be controlled according to a type of the high refractive particle. For example, as the high refractive particle, zinc oxide having a refractive index of 2.00 is used, the charged high refractive particle 152 may be included in an amount of 2 wt % to 3 wt % based on the total amount of the ink 150 and within this range, the luminance is excellent and the ghost mura phenomenon is improved. As another example, as the charged high refractive particle, titanium dioxide having a refractive index of 2.60 is used, the charged high refractive particles 152 are included in an amount of 1.5 wt % to 2.3 wt % based on a total weight of the ink 150.

The ink 150 may further include a dispersant. A dispersant having a basic functional group may be used. For example, the dispersant may be polyisobutylene succinimide amine expressed by the following Formula 1.

[Formula 1]

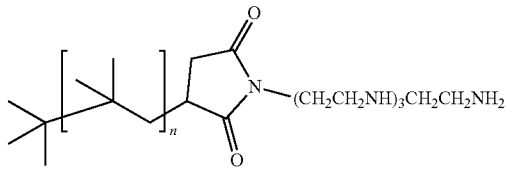

In Formula 1, n is an integer of 5 to 500.

An amine group of the dispersant expressed by Formula 1 reacts with a functional group bonded to the surface of the charged black particles 151. The dispersant expressed by Formula 1 is formed to be bonded to the surface of the charged black particles 151 to enclose the surface of the charged black particles 151. The dispersant expressed by Formula 1 has a long chain length so that the dispersant encloses the surface of the charged black particles 151 to function as a protective layer to suppress aggregation between particles. Further, the dispersant expressed by Formula 1 allows the negatively charged black particles 151 to stably maintain a charged state. By doing this, the repulsive force between particles is induced to minimize the aggregation between particles. Accordingly, the dispersion property of the charged black particles 151 is improved and the dispersion stability of the ink 150 is improved to improve the driving characteristic of the viewing angle controlling film 100.

For example, the dispersant may be included in an amount of 0.05 wt % to 5 wt % based on the total weight of the ink 150. When the content of the dispersant is too small, the improvement effect of the dispersion stability may be insignificant. A molecular weight of the dispersant is large so that when the dispersant is excessively added, the dispersant may increase the viscosity of the ink 150. When the viscosity of the ink 150 is increased, the movement of the charged black particles 151 is not easy so that the driving characteristic of the viewing angle controlling film 100 may be degraded.

The ink 150 may further include a surfactant. For example, the surfactant may be a phosphate-based compound, but is not limited thereto. Specifically, for example, the surfactant may be selected from tricresyl phosphate and tributyl phosphate, but is not limited thereto. The surfactant increases the permittivity of the ink 150 to improve a response speed of the viewing angle controlling film 100.

The second electrode 120b is disposed on the transparent resin layer 130. The second electrode 120b is substantially the same as the above-described first electrode 120a except that it is disposed above the transparent resin layer 130. Further, the second base member 110b is disposed on the second electrode 120b. The second base member 110b is substantially the same as the above-described first base member 110a except that it is disposed on the second electrode 120b. Accordingly, a redundant description will be omitted.

An adhesive layer ADH is disposed between the transparent resin layer 130 and the first electrode 120a. For example, the viewing angle controlling film 100 is manufactured by manufacturing a first assembly configured by the first base member 110a and the first electrode 120a and manufacturing a second assembly configured by the second base member 110b, the second electrode 120b, and the transparent resin layer 130 in which the ink 150 is accommodated in the plurality of accommodating units 140, and then bonding the first assembly and the second assembly. In this case, after injecting the ink 150 in the plurality of accommodating units 140, the first assembly and the second assembly are bonded using the adhesive layer ADH. However, it is not limited thereto so that the adhesive layer ADH may be disposed between the transparent resin layer 130 and the second electrode 120b or may be omitted according to the manufacturing process or the structure of the viewing angle controlling film 100.

For example, a thickness of the adhesive layer ADH may be 1 μm to 100 μm, but is not limited thereto.

For example, the adhesive layer ADH may be formed of a material selected from an optically clear adhesive (OCA), an optically clear resin (OCR), or a pressure sensitive adhesive (PSA), but is not limited thereto.

Hereinafter, a wide viewing angle mode and a narrow viewing angle mode will be described in more detail with reference to FIGS. 3A and 3B.

Figure 3A:
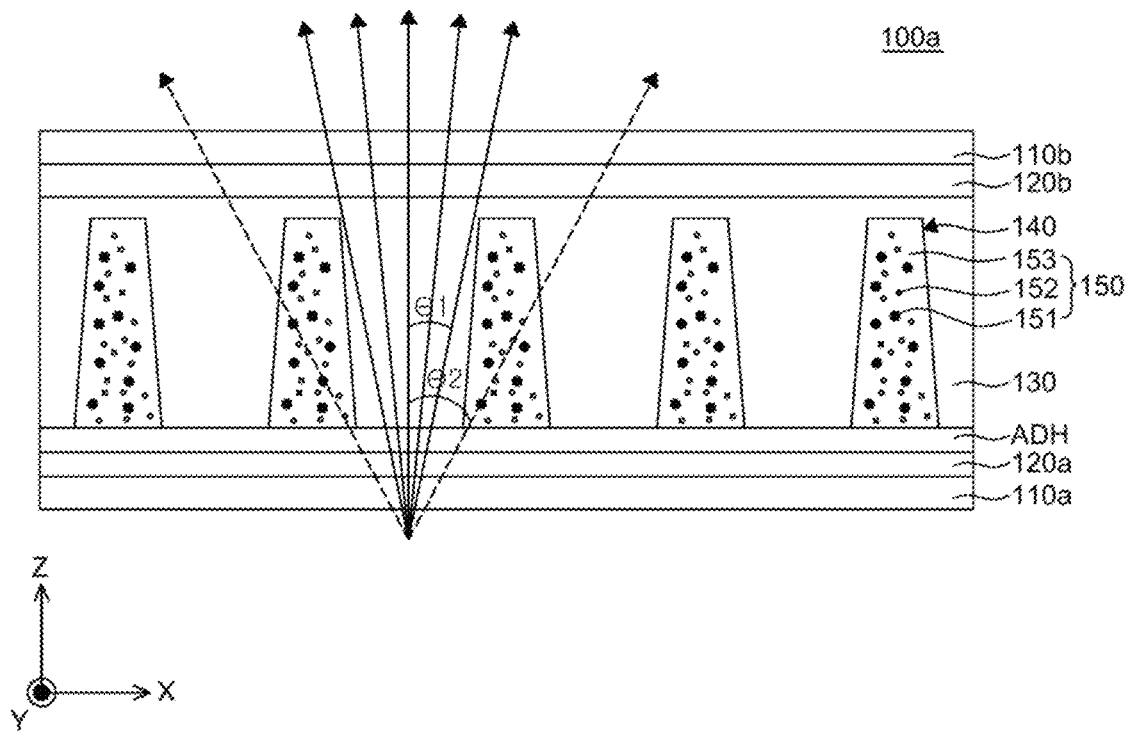
FIG. 3A is a schematic cross-sectional view when a viewing angle controlling film according to an exemplary aspect of the present disclosure is in a narrow viewing angle mode.

FIG. 3A is a schematic cross-sectional view when a viewing angle controlling film according to an exemplary aspect of the present disclosure is in a narrow viewing angle mode. FIG. 3B is a schematic cross-sectional view when a viewing angle controlling film according to an exemplary aspect of the present disclosure is in a wide viewing angle mode.

Referring to FIG. 3A, when an electric field is not formed between the first electrode 120a and the second electrode 120b, the charged black particles 151 and the charged high refractive particles 152 are uniformly dispersed in the solvent 152 to be randomly distributed inside each of the plurality of accommodating units 140. As the charged black particles 151 are randomly dispersed inside each of the plurality of accommodating units 140, some of light incident onto the plurality of accommodating units 140 may be absorbed by the charged black particles 151. That is, light which is incident at a predetermined angle or larger is blocked by the plurality of accommodating units 140. That is, among light which is incident from the lower portion of the viewing angle controlling film 100a, light which is incident at a predetermined angle or larger with respect to the front surface (z axis) is absorbed by the charged black particles 151 dispersed in the plurality of accommodating units 140. Therefore, the light is not emitted to the outside of the viewing angle controlling film 100a. For example, among light incident from the lower portion of the viewing angle controlling film 100a, light incident onto the front surface (z axis) at a first angle θ1 is output to the outside of the viewing angle controlling film 100a. However, light which is incident at a second angle θ2 which is larger than the first angle is not emitted to the outside. Accordingly, light which is incident at a predetermined angle or larger is blocked to operate in a narrow viewing angle mode.

In the meantime, the charged high refractive particles 152 are uniformly dispersed in the solvent 153 to reduce the refractive index difference between the ink 150 and the transparent resin layer 130, thereby suppressing the ghost mura phenomenon in which the images look overlapped.

Figure 3B:
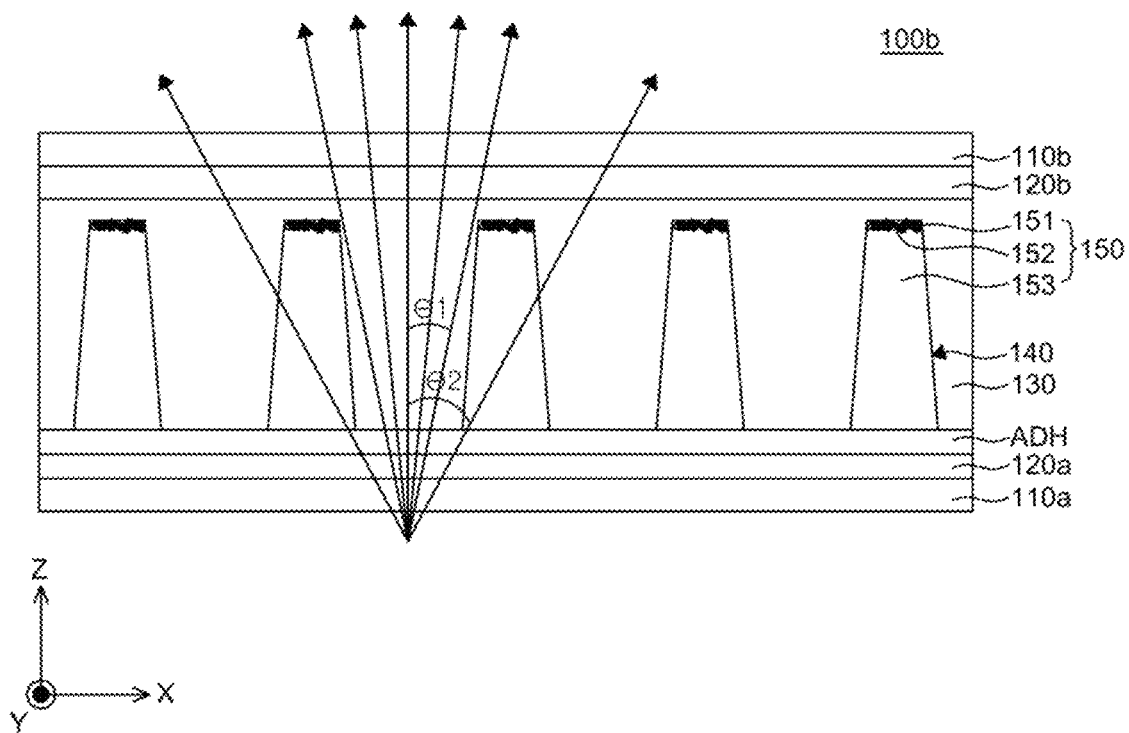
FIG. 3B is a schematic cross-sectional view when a viewing angle controlling film according to an exemplary aspect of the present disclosure is in a wide viewing angle mode.

Referring to FIG. 3B, when a voltage is applied between the first electrode 120a and the second electrode 120b so that the electric field is formed, the charged black particles 151 which are randomly dispersed in the plurality of accommodating units 140 move to the electrode by the electric field. That is, the charged black particles 151 move to an electrode to which an opposite voltage is applied, according to the charged charge.

For example, when the charged black particles 151 are charged with a negative charge, if the negative voltage is applied to the first electrode 120a and the positive voltage is applied to the second electrode 120b, the black particles 151 which are charged with a negative charge moves to an upper surface 142. The upper surface 142 is adjacent to the second electrode 120b to which a positive voltage is applied. Accordingly, the charged black particles 151 are stacked from the upper surface 142 of the accommodating units 140 with a predetermined thickness. That is, in the most area other than an area adjacent to the upper surface 142 of the accommodating unit 140 in which the charged black particles 151 are stacked, the charged black particles 151 hardly exist. Accordingly, an angle of light to be emitted to the outside of the viewing angle controlling film 100b is widened. Specifically, among light incident from the lower portion of the viewing angle controlling film 100b, not only light incident at a first angle θ1 with respect to the front surface (z axis), but also light incident at the second angle θ2 which is larger than the first angle is emitted to the outside. Accordingly, a traveling angle of light which is emitted to the outside of the viewing angle controlling film 100b is increased as compared with that illustrated in FIG. 3A to operate in the wide viewing angle mode.

As another example, when the charged black particles 151 are charged with a negative charge, a positive voltage is applied to the first electrode 120a and a negative voltage is applied to the second electrode 120b to operate the wide viewing angle mode similar to FIG. 3B. A redundant description thereof will be omitted.

In order to quickly switch from the narrow viewing angle mode to the wide viewing angle mode, when the electric field is formed, the black particles 151 need to quickly move to an electrode to which an opposite voltage is applied. For example, the charged black particles 151 which are charged with a negative charge applies a negative voltage to the first electrode 120a and when the positive voltage is applied to the second electrode 120b, the black particles 151 needs to quickly move to an upper surface 142. The upper surface 142 is adjacent to the second electrode 120b to which a positive voltage is applied. Accordingly, the black particles 151 charged with the negative charge need to have a negative charge quantity so as to quickly move under the driving voltage of the viewing angle controlling film 100b. For example, a charge quantity of the black particles 151 charged with a negative charge may be −25 mV to −50 mV. At this time, a driving voltage of the viewing angle controlling film 100b may be 10 V to 60 V. Within this range, when a voltage is applied to the first electrode 120a and the second electrode 120b, the charged black particles 151 quickly move so that the switching speed of the wide viewing angle mode and the narrow viewing angle mode is excellent and the driving characteristic and the stability of the viewing angle controlling film 100b are excellent.

In the meantime, the charged high refractive particles 152 are added to the ink 150 having a refractive index lower than that of the transparent resin layer 130 so that the refractive index of the ink 150 is controlled to be substantially equal to the refractive index of the transparent resin layer 130. Accordingly, the refractive index difference between the ink 150 and the transparent resin layer 130 is significantly reduced so that the ghost mura phenomenon may be minimized. Accordingly, the charged high refractive particles 152 need to maintain a uniformly dispersed state in the ink 150 regardless of the presence of the electric field.

For example, when the charged black particles 151 are charged with a negative charge, the charged high refractive particles 152 are charged with a positive charge which is opposite to the charged black particles 151. However, when the electric field is applied, the high refractive particles 152 which are charged with a positive charge is not attracted to the electrode to which a negative voltage which is opposite thereto is applied, but are uniformly dispersed in the ink 150. That is, even though the negative voltage is applied to the first electrode 120a and the positive voltage is applied to the second electrode 120b, the positively charged high refractive particles 152 are not attracted to the lower surface 141 adjacent to the first electrode 120a applied with a negative voltage, but are relatively uniformly dispersed in the accommodating unit 140. Accordingly, regardless of the formation of the electric field, the refractive index of the ink 150 and the refractive index of the transparent resin layer 130 are maintained to be equal so that the ghost mura phenomenon is improved.

The high refractive particles 152 charged with a positive charge need to have a low positive charge quantity so as not to be attracted to the first electrode 120a applied with the negative voltage when the electric field is formed. For example, a charge quantity of the high refractive particles 152 charged with a positive charge may be +5 mV to +11 mV. In this case, the charged high refractive particles 152 is not attracted to the electrode applied with an opposite voltage under the driving voltage of the viewing angle controlling film 100b, but may maintain a uniformly dispersed state in the accommodating unit 140. Accordingly, the ghost mura phenomenon of the viewing angle controlling film 100b may be minimized.

The charge quantity of the charged high refractive particles 152 may be controlled by pH of a solution when the high refractive particles 152 are synthesized. For example, when zinc oxide particles are synthesized using a zinc precursor, pH of a reaction solution may be controlled in the range of 8 to 9 using sodium hydroxide. A charge quantity of the charged high refractive particles 152 prepared thereby may be in the range of +5 mV to +11 mV.

The viewing angle is controlled by a width W1 of the lower surface 141 of the accommodating unit 140, a width W2 of the upper surface 142, a distance D1 from the lower surface 141 to the upper surface 142 (that is, a height of the accommodating unit 140), distances W3 and W4 between adjacent accommodating units 140, and a gradient of the first and second connection units 143a and 143b.

Referring to FIG. 2, a width W1 of the lower surface 141 is 25 µm to 50 µm and a width W2 of the upper surface 142 is 5 µm to 15 µm. Further, a distance from the lower surface 141 to the upper surface 142, that is, a height D1 of the accommodating unit 140 may be 100 µm to 160 µm. The distance W3 between the lower surfaces 141 of adjacent accommodating units 140 is 15 µm to 50 µm and the distance W4 between upper surfaces 142 is 25 µm to 60 µm. Within this range, in the wide viewing angle mode, a wider viewing angle may be provided without degrading the luminance and in the narrow viewing angle mode, a traveling angle of emitted light is sufficiently small to provide a narrow viewing angle. Further, the width W1 of the lower surface 141 is desirably formed to be larger than the width W2 of the upper surface 142. In this case, in the wide viewing angle mode, a wider viewing angle may be provided.

An angle θa formed by the first connection unit 143a and the lower surface 141 and an angle θb formed by the second connection unit 143b and the lower surface 141 may be 90° to 120°. Within this range, in the wide viewing angle mode, a wide viewing angle may be provided and in the narrow angle mode, a traveling angle of the emitted light is reduced to implement a narrow viewing angle.

Even though in FIGS. 1, 2, 3A, and 3B, it is illustrated that the angle θa formed by the first connection unit 143a and the lower surface 141 is equal to the angle θb formed by the second connection unit 143b and the lower surface 141 may be 90° to 105°. However, it is just an example so that the present disclosure is not limited thereto. The angle θa formed by the first connection unit 143a and the lower surface 141 and an angle θb formed by the second connection unit 143b and the lower surface 141 may be different.

As described above, the upper surface 142 of each of the plurality of accommodating unit 140 is spaced apart from the second electrode 120b. For example, the distance D2 from the upper surface 142 to the second electrode 120b may be 5 µm to 40 µm. The transparent resin layer 130 which has an insulating property is formed in a space where the upper surface 142 and the second electrode 120b are spaced apart from each other. Therefore, when the distance D2 is too long, an intensity of the electric field is reduced under the same voltage so that the driving characteristic may be degraded.

Figure 4:
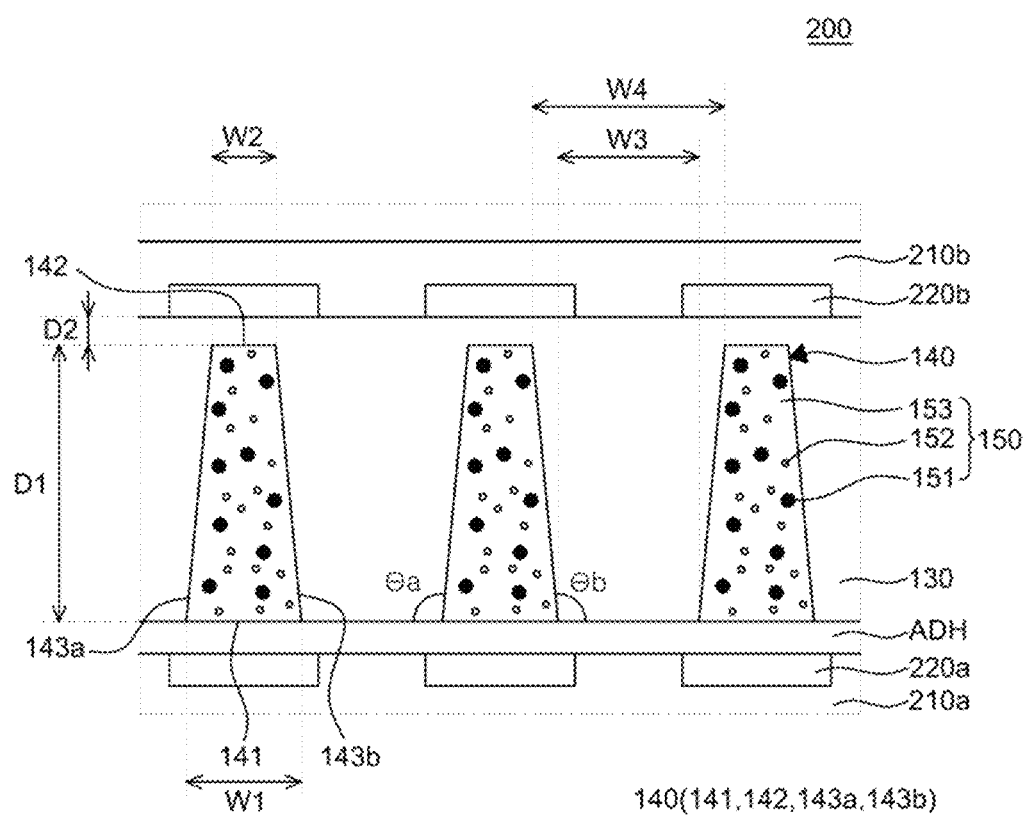
FIG. 4 is a schematic cross-sectional view of a viewing angle controlling film according to another exemplary aspect of the present disclosure.

FIG. 4 is a schematic cross-sectional view of a viewing angle controlling film according to another exemplary aspect of the present disclosure.

A viewing angle controlling film 200 illustrated in FIG. 4 is substantially the same as the viewing angle controlling film 100 illustrated in FIGS. 1 and 2, except that the first electrode and the second electrode are patterned and a structure of the first and second base members is changed. Accordingly, a redundant description will be omitted. Even though in FIG. 4, it is illustrated that the first electrode and the second electrode have a patterned structure, it is not limited thereto. If necessary, only any one of the first electrode and the second electrode has a patterned structure.

Referring to FIG. 4, a plurality of pattern electrodes 220a is disposed below the adhesive layer ADH and a plurality of second pattern electrodes 220b is disposed above the transparent resin layer 130.

Each of the plurality of first pattern electrodes 220a is disposed so as to overlap each of the plurality of accommodating units 140.

Each of the plurality of first pattern electrodes 220a extends along the second direction (a y axis direction) which is perpendicular to the thickness direction (a z axis direction) and the first direction (an x axis direction). Therefore, each of the plurality of first pattern electrodes 220a has a line shape extending along the second direction (a y axis direction).

The first base member 210a may be disposed so as to cover the surface and the side surface of the plurality of first pattern electrodes 220a. That is, the first base member 210a is disposed to cover the step formed by the plurality of first pattern electrodes 220a.

Each of the plurality of second pattern electrodes 220b is disposed so as to overlap each of the plurality of first pattern electrodes 220a. Therefore, each of the plurality of second pattern electrodes 220b overlaps each of the plurality of accommodating units 140.

The second pattern electrode 220b has a line shape extending along the second direction (the y axis direction) perpendicular to the thickness direction (the z axis direction) and the first direction (the x axis direction), similarly to the first pattern electrode 220a.

The second base member 210b may be disposed so as to cover the surface and the side surface of the plurality of second pattern electrodes 220b. That is, the second base member 210b is disposed to cover the step formed by the plurality of second pattern electrodes 220b.

For example, widths of the plurality of first electrode patterns 220a and the plurality of second electrode patterns 220b may be 5 µm to 60 µm. However, it is not limited thereto and the width W1 of the lower surface 141 and/or the width W2 of the upper surface 142 may be changed according to the design.

As illustrated in FIG. 4, when the electrode is patterned to be configured as a plurality of pattern electrodes 220a and a plurality of pattern electrodes 220b, a leakage current generated in the transparent resin layer 130 and the adhesive layer ADH may be minimized. As the leakage current is minimized, the mobility of the charged black particles 151 in the plurality of accommodating units 140 is further improved, and the driving characteristic of the viewing angle controlling film and a mode switching speed may be further improved.

A viewing angle controlling film 100 of the present disclosure is used for an organic light emitting display device or a liquid crystal display device.

Figure 5:
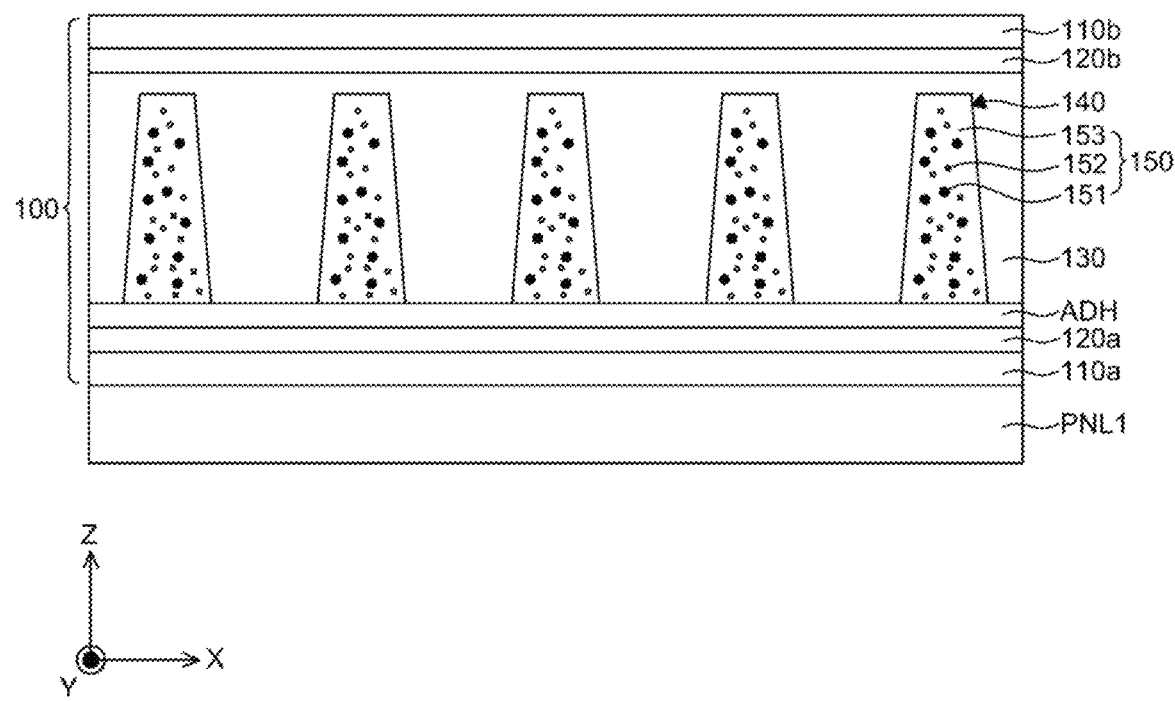
FIG. 5 is a schematic cross-sectional view of an organic light emitting display apparatus according to an exemplary aspect of the present disclosure.

FIG. 5 is a schematic cross-sectional view of an organic light emitting display apparatus according to an exemplary aspect of the present disclosure. Referring to FIG. 5, an organic light emitting display device 500 according to an exemplary aspect of the present disclosure includes an organic light emitting display panel PNL1 and a viewing angle controlling film 100. The viewing angle controlling film 100 includes a first base member 110*a*, a first pattern electrode 120*a*, a transparent resin layer 130, a second pattern electrode 120*b*, and a second base member 110*b*. The viewing angle controlling film 200 in the organic light emitting display device 500 illustrated in FIG. 5 is substantially the same as the viewing angle controlling film 100 illustrated in FIGS. 1 and 2. Therefore, a redundant description will be omitted.

The organic light emitting display panel PNL1 includes an organic light emitting layer to display images using light emitted therefrom. For example, the organic light emitting display panel PNL1 includes a substrate, a thin film transistor, an anode, an organic light emitting stack, a cathode, and an encapsulation layer.

The substrate is a base member which supports various elements of the organic light emitting display panel PNL1 and is formed of an insulating material. For example, the substrate may be a glass substrate or a plastic substrate. For example, the plastic substrate may be selected from polyimide, polyethersulfone, polyethylene terephthalate, and polycarbonate, but is not limited thereto.

The thin film transistor is disposed on the substrate. The thin film transistor includes a gate electrode, an active layer, a source electrode, and a drain electrode. For example, the active layer is disposed on the substrate and a gate insulating layer is disposed on the active layer to insulate the active layer from the gate electrode. Further, an interlayer insulating layer which insulates the gate electrode from the source electrode and the drain electrode is disposed on the substrate. The source electrode and the drain electrode which are in contact with the active layer are formed on the interlayer insulating layer. A planarization layer may be disposed on the thin film transistor. The planarization layer planarizes an upper portion of the thin film transistor. The planarization layer may include a contact hole which electrically connects the thin film transistor and the anode.

The anode is disposed on the planarization layer. The anode is a component which supplies holes to the organic light emitting layer and is formed of a conductive material having a high work function. The anode may be divided for each of the sub pixels. The cathode is disposed on the anode. The cathode may be formed of a metal material having a low work function to smoothly supply electrons to the organic light emitting layer. The cathode is formed on the anode as one layer without being patterned. That is, the cathode is not divided for every sub pixel area but is formed as a continuous single layer. The organic light emitting layer is disposed between the anode and the cathode. The organic light emitting layer is a layer in which electrons and holes are coupled to emit light. An encapsulation layer which minimizes degradation of the display panel due to moisture or oxygen and planarizes an upper surface of the organic light emitting display panel PNL1 is disposed on the cathode.

The viewing angle controlling film 100 is disposed on the organic light emitting display panel PNL1. For example, the viewing angle controlling film 100 is disposed on the encapsulation layer of the organic light emitting display panel PNL1.

The viewing angle controlling film 100 is disposed on the organic light emitting display panel PNL1 to provide a narrow viewing angle mode and a wide viewing angle mode. The narrow viewing angle mode provides a narrow viewing angle to allow the user to see an image formed by light emitted from the organic light emitting layer of the organic light emitting display panel PNL1. The wide viewing angle mode provides a wide viewing angle to allow the other people in the vicinity thereof to see the image. The configuration of the viewing angle controlling film 100, the narrow viewing angle mode, and the wide viewing angle mode are the same as those described above with reference to FIGS. 1, 2, 3A, and 3B so that a redundant description thereof will be omitted.

Figure 6:
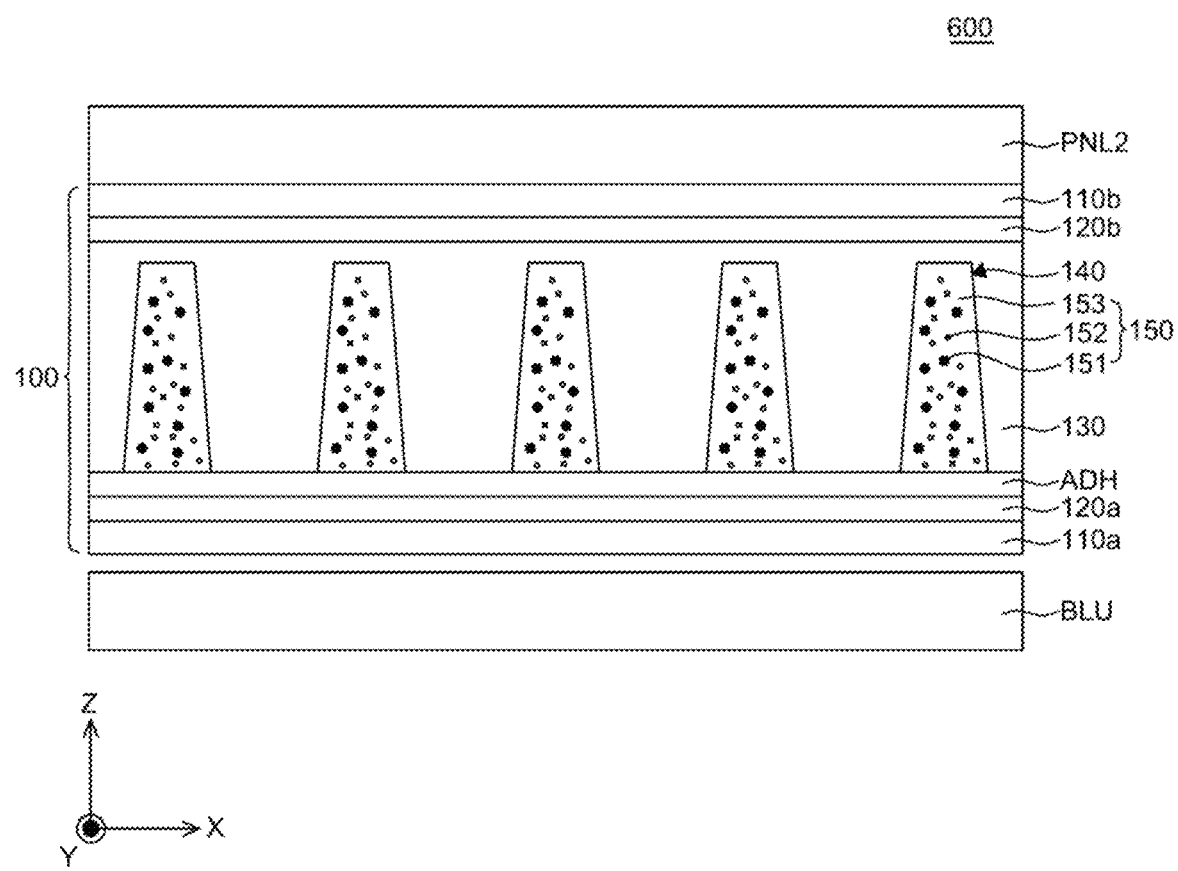
FIG. 6 is a schematic cross-sectional view of a liquid crystal display device according to an exemplary aspect of the present disclosure.

FIG. 6 is a schematic cross-sectional view of a liquid crystal display device according to an exemplary aspect of the present disclosure. Referring to FIG. 6, a liquid crystal display device 600 according to an exemplary aspect of the present disclosure includes a backlight unit BLU, a viewing angle controlling film 200, and a liquid crystal display panel PNL2. The viewing angle controlling film 100 includes a first base member 110*a*, a first pattern electrode 120*a*, a transparent resin layer 130, a second pattern electrode 120*b*, and a second base member 110*b*. The viewing angle controlling film 100 in the liquid crystal display device 600 illustrated in FIG. 6 is substantially the same as the viewing angle controlling film 100 illustrated in FIGS. 1 and 2. Therefore, a redundant description will be omitted.

The backlight unit BLU includes a plurality of light sources to supply light to the liquid crystal display panel PNL2. A plurality of light sources is electrically connected to a printed circuit board to be turned on or off. For example, the light source may be a light emitting diode (LED) having advantages of high efficiency, high luminance, and low power consumption, but is not limited thereto.

The backlight unit BLU includes a light diffusion plate disposed on the plurality of light sources to condense and diffuse light emitted from the plurality of light sources so that the light is evenly incident on the liquid crystal display panel PNL2.

A reflective layer which reflects light generated from the light source to the front surface is disposed on a rear surface of the back light unit BLU.

The liquid crystal display panel PNL2 is disposed on the backlight unit BLU. The liquid crystal display panel PNL2 includes a liquid crystal layer and controls light transmittance of the liquid crystal to display images.

For example, the liquid crystal display panel PNL2 includes a lower substrate, an upper substrate, a lower polarizer, and an upper polarizer.

The lower substrate supports various components which configures the liquid crystal display panel PNL2. On the lower substrate, a thin film transistor, a pixel electrode which is electrically connected to the thin film transistor, and a common electrode which forms an electric field together with the pixel electrode are disposed. Therefore, the lower substrate may be referred to as a thin film transistor substrate. A liquid crystal layer including liquid crystal molecules is disposed on the thin film transistor substrate.

The upper substrate is opposite to the lower substrate. A color filter layer and a black matrix layer are disposed on the upper substrate. The color filter layer selectively transmits light having a specific wavelength. Light emitted from the backlight unit BLU passes through the liquid crystal layer and the color filter to be converted into light having various colors. The black matrix layer does not allow the thin film transistor disposed on the lower substrate to be visible to the outside of the liquid crystal display device 600.

The lower polarizer is disposed on a lower surface of the lower substrate to polarize light emitted from the backlight unit BLU toward the liquid crystal display panel PNL2. The upper polarizer is disposed on an upper surface of the upper substrate and polarizes light emitted to the outside of the liquid crystal display panel PNL2.

The viewing angle controlling film 100 is disposed between the backlight unit BLU and the liquid crystal display panel PNL2. The viewing angle controlling film 100 controls a traveling angle of light emitted from the backlight unit BLU to provide a wide viewing angle mode and a narrow viewing angle mode.

Specifically, the viewing angle controlling film 100 is disposed on the backlight unit BLU to provide a narrow viewing angle mode and a wide viewing angle mode. In the narrow viewing angle mode, a viewing angle of light incident from the backlight unit BLU is controlled to be narrow so that the image displayed on the liquid crystal display panel PNL2 is visible to the user. In the wide viewing angle mode, a viewing angle of light incident from the backlight unit BLU is controlled to be wide so that a wide viewing angle is provided to allow the surrounding people to see the image displayed on the liquid crystal display panel PNL2. The configuration of the viewing angle controlling film 100, the narrow viewing angle mode, and the wide viewing angle mode are the same as those described above with reference to FIGS. 1, 2, 3A, and 3B so that a redundant description thereof will be omitted.

Hereinafter, the effects of the present disclosure will be described in more detail with reference to Examples and Comparative Examples. However, the following Examples are set forth to illustrate the present disclosure, but the scope of the disclosure is not limited thereto.

Example 1

1. Preparing of Charged High Refractive Particle 30 ml of 4 M NaOH aqueous solution and 20 ml of 1 M $ZnCl_2$ aqueous solution were mixed with stirring at room temperature. Next, in a separate container, 50 ml of previously prepared mixed solution (pH 8 to 9), 45 ml of distilled water, and 5 ml of 0.2 M cetyltrimethaneammonium bromide (CTAB) were added and stirred at room temperature for 1 hour and 30 minutes. Next, the stirring was stopped and thermal treatment was conducted at 100° C. for 4 hours. The resulting white precipitate was cleansed three or more times with distilled water and dried at 100° C. to prepare charged zinc oxide particles.

2. Preparing of Ink 10 g of carbon black (density of 1.8 to 2.1 g/cm3) was added to 100 ml of 65 wt % nitric acid and stirred at 100° C. for 24 hours to react. After completing the reaction, centrifugation was performed at 7500 rpm for 15 minutes and then precipitate was separated and cleansing was performed with distilled water. Next, it was dried at 120° C. for 24 hours to obtain carbon black particles surface-modified with a functional group —COO— group. Next, after preparing a solvent Isopar L (density was 0.764 g/cm3) in a separate container, polyisobutylene succinimide amine (Trade name T151) was added with a concentration of 0.2 wt %. Next, 0.1 g of a surface-modified carbon black particle was added to 15 g of the solvent-dispersant mixed solution, followed by ultrasonic treatment for 2 hours. Next, the charged zinc oxide prepared as described above was added with a concentration of 3 wt % based on 100 wt % of a composition to prepare an ink. For reference, it was confirmed that a charge quantity (zeta voltage) of the charged carbon black particles was −30 mV to −35 mV, the average particle size of the charged zinc oxide particles was 10.2 nm, and a charge quantity (zeta voltage) was +9.6 mV.

3. Preparing of Viewing Angle Controlling Film

One pair of electrode films was prepared by depositing an ITO electrode with a thickness of 25 μm on an entire surface of a PET film with a thickness of 35 μm. Next, a resin composition including 90 wt % of urethane acrylate, 3 wt % of diphenyl (2,4,6-trimethylbenzoyl)phosphine oxide, 2 wt % of a release agent, and 5 wt % of tricresyl phosphate (or tributyl phosphate) was prepared. A plurality of accommodating unit was formed on one electrode among the previously prepared electrode films using an imprinting process (or a master mold process) and the above-prepared ink was injected into the plurality of accommodating unit to form the transparent resin layer as the same as illustrated in FIG. 1. At this time, a width of the lower surface of the accommodating unit was 32 μm, a width of the upper surface was 8 μm, and a height was 140 μm. Next, an optically clear adhesive was used to bond an electrode film on which the transparent resin layer was formed and the other electrode film to prepare a viewing angle controlling film.

Comparative Example 1

Except for omitting a step of adding the charged zinc oxide particle in the ink preparing process of Example 1, an ink was prepared using the same method as Example 1. The viewing angle controlling film was prepared using the ink prepared as described above with the same method as Example 1.

Comparative Example 2

Except for adding an uncharged zinc oxide particle instead of the charged zinc oxide particle in the ink preparing process of Example 1, an ink was prepared using the same method as Example 1. The viewing angle controlling film was prepared using the ink prepared as described above using the same method as Example 1.

Experimental Example 1

A luminance was measured after bonding the viewing angle controlling films according to Example 1 and Comparative Example 1 and 2 onto the display panel. The luminance was measured using SpectraDuo PR-680 and the result thereof was illustrated in FIG. 7. Further, it was identified whether a ghost mura was generated in the display device including the viewing angle controlling film according to Example 1 and Comparative Example 1.

Figure 7:
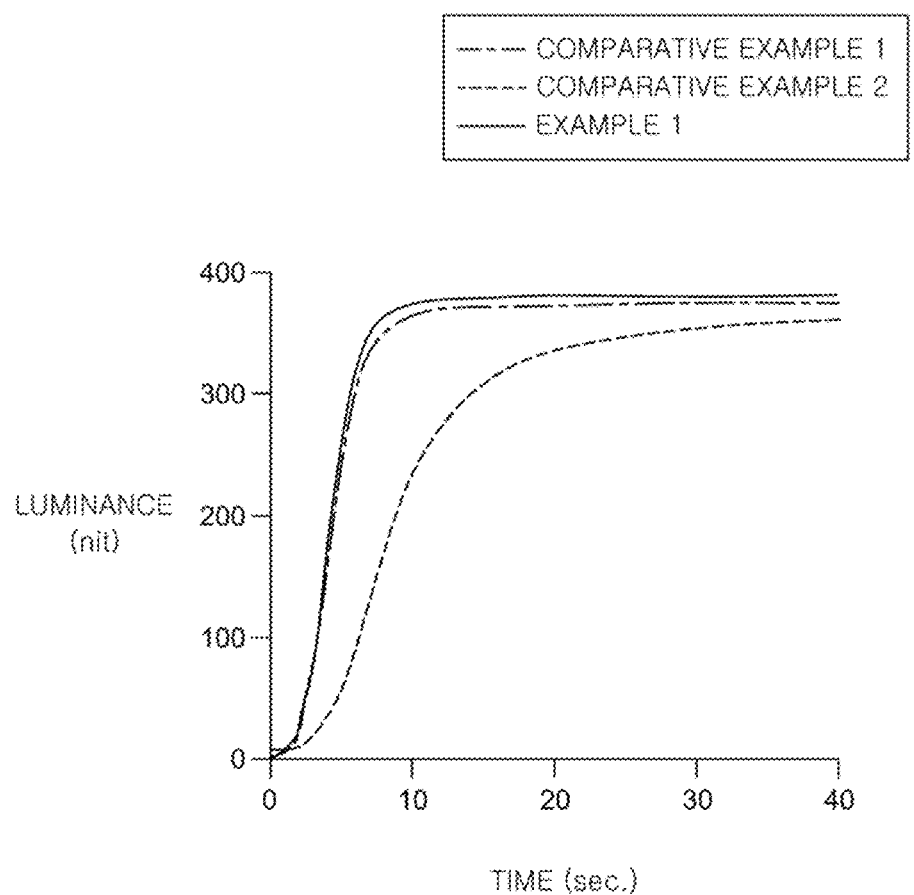
FIG. 7 is a graph illustrating a luminance measurement result of a display device including a viewing angle controlling film according to Example 1 and Comparative Examples 1 and 2.
Figure 8:
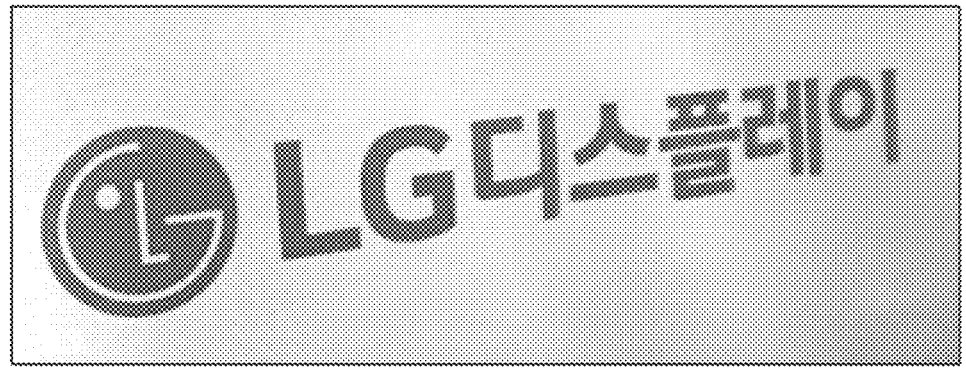
FIG. 8 is a photograph illustrating that the ghost mura phenomenon is not generated in a display device including a viewing angle controlling film according to Example 1.
Figure 9:
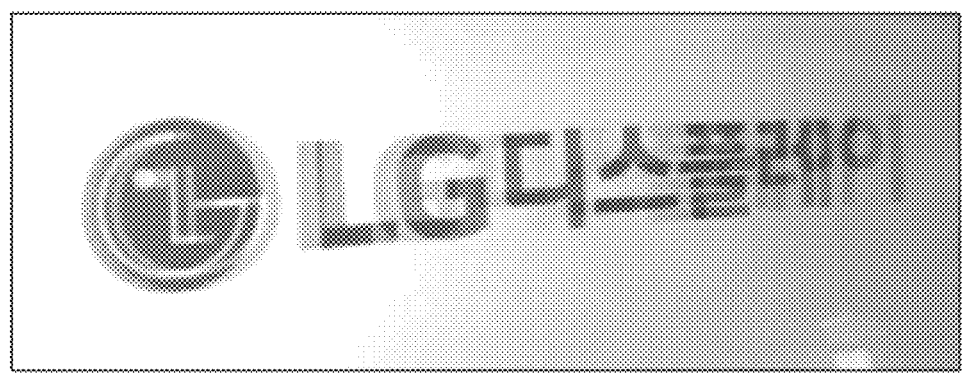
FIG. 9 is a photograph illustrating that the ghost mura phenomenon is generated in a display device including a viewing angle controlling film according to Comparative Example 1.

FIG. 7 is a graph illustrating a luminance measurement result of a display device including a viewing angle controlling film according to Example 1 and Comparative Examples 1 and 2. FIG. 8 is a photograph illustrating that the ghost mura phenomenon is not generated in a display device including a viewing angle controlling film according to Example 1. FIG. 9 is a photograph illustrating that the ghost mura phenomenon is generated in a display device including a viewing angle controlling film according to Comparative Example 1.

First, referring to FIGS. 7 and 8 together, it is confirmed that in the display device including the viewing angle controlling film according to Example 1, the ghost mura phenomenon is not observed and the display quality is excellent.

Referring to FIGS. 7 and 9 together, it is confirmed that in the display device including the viewing angle controlling film according to Comparative Example 1, even though the luminance is excellent, the ghost mura phenomenon is observed so that the display quality is degraded.

That is, when the ink including high refractive particles charged with a charge opposite to the charged black particles is used, the ghost mura phenomenon may be improved. It is determined because the charged high refractive particles are introduced to reduce the difference in the refractive index of the ink and the refractive index of the transparent resin layer. For reference, in the viewing angle controlling films according to Example 1 and Comparative Example 1, a refractive index of the transparent resin layer is 1.498 and a refractive index of the ink according to Comparative Example 1 is 1.437. It is considered that due to the difference of the refractive index of the ink according to Comparative Example 1 and the transparent resin layer, as illustrated in FIG. 9, the ghost mura phenomenon is generated. In contrast, the refractive index of the ink according to Example 1 is 1.491 which is almost equal to the refractive index of the transparent resin layer. Accordingly, when the viewing angle controlling film according to Example 1 is included, as seen from FIG. 8, a result that the ghost mura phenomenon is improved is shown.

In the meantime, referring to FIG. 7, in the case of Comparative Example 2 including high refractive particles which are not charged, it is confirmed that the refractive index difference of the ink and the transparent resin layer may be reduced, but the luminance is worse than that of Example 1.

From the summary of Experimental Example 1, it is understood that when the ink including the high refractive particles which are charged with charges opposite to the charged black particles is used, the ghost mura phenomenon is improved while maintaining the luminance to be high.

In order to confirm the effect according to the content of the charged high refractive particles, the inventors prepared an ink and a viewing angle controlling film according to Reference Examples 1 and 2 as it will be described below.

Reference Example 1

The ink was prepared by the same method as that in Example 1 except that a concentration of the charged zinc oxide particles was changed from 3 wt % to 4 wt % in Example 1. The viewing angle controlling film was prepared using the ink prepared as described above with the same method as Example 1.

Reference Example 2

The ink was prepared by the same method as that in Example 1 except that a concentration of the charged zinc oxide particles was changed from 3 wt % to 5 wt % in Example 1. The viewing angle controlling film was prepared using the ink prepared as described above with the same method as Example 1.

Experimental Example 2

A light transmittance and a reflective haze of the viewing angle controlling films according to Example 1, Reference Example 1, and Reference Example 2 were measured. Further, the viewing angle controlling films according to Example 1, Reference Example 1, and Reference Example 2 were bonded onto the organic light emitting display panel and the luminance (wide viewing angle mode) and the mode switching speed were measured. The results were represented in the following Table 1.

TABLE 1

|  | Example 1 | Reference Ex. 1 | Reference Ex. 2 |
|---|---|---|---|
| Charged zinc oxide content | 3 wt % | 4 wt % | 5 wt % |
| Light transmittance | 80.8% | 79.9% | 78% |
| Reflective haze | 0.72 | 1.2 | 1.85 |
| Luminance (Wide viewing angle mode) | 87.9% | 82.4% | 78.8% |
| Mode switching speed | 2.7 seconds | 3.1 seconds | 3.3 seconds |

Referring to Table 1, it is understood that when a content of the charged zinc oxide particles in the ink exceeds 3 wt %, the light transmittance of the viewing angle controlling film is degraded less than 80% and the reflective haze is increased. Therefore, it is confirmed that in the organic light emitting display device including the viewing angle controlling film according to Reference Examples 1 and 2, in the wide viewing angle mode, as compared with Example 1, the luminance is worse and the mode switching speed is slower.

Further, the charged zinc oxide was added during the preparing of the ink to control the refractive index to be similar to that of the transparent resin layer having a high refractive index. However, it was confirmed that when the concentration of the charged zinc oxide particles in the ink exceeded 3.5 wt %, the refractive index of the ink increased to be 1.51 or higher. Accordingly, the concentration of the charged zinc oxide particles in the ink exceeds 3.5 wt %, the refractive index becomes higher than the refractive index of the transparent resin layer so that the ghost mura phenomenon is caused.

That is, in order to suppress the ghost mura phenomenon while maintaining the light transmittance of the viewing angle controlling film to be high, a content range of the charged high refractive particles needed to be controlled. Further, it was confirmed that when the charged zinc oxide particles were added in an amount of 2 wt % to 3 wt % based on the total weight of the ink, the best effect was obtained.

Experimental Example 3

In order to confirm the effect according to the average particle size of the charged high refractive particles in the ink, the inventors prepared inks which were the same as that of Example 1, but had different average particle sizes of the charged high refractive particles. Further, the viewing angle controlling films were prepared using inks prepared as described above. The average particle sizes and the charge quantity (zeta potential) of the charged high refractive particles for each ink were measured and the refractive index and particle settling speed of the ink were measured (Lumisizer Dispersion Analyzers).

Further, the viewing angle controlling film prepared as described above was bonded onto the organic light emitting display panel to prepare the organic light emitting display device and the luminance (30° side surface) of the organic light emitting device was measured in each of the wide viewing angle mode and the narrow viewing angle mode. The results were represented in the following Table 2 and FIG. 10.

Further, it was identified whether the ghost mura was generated in the organic light emitting display device prepared as described above and the result was illustrated in FIG. 11.

Figure 10:
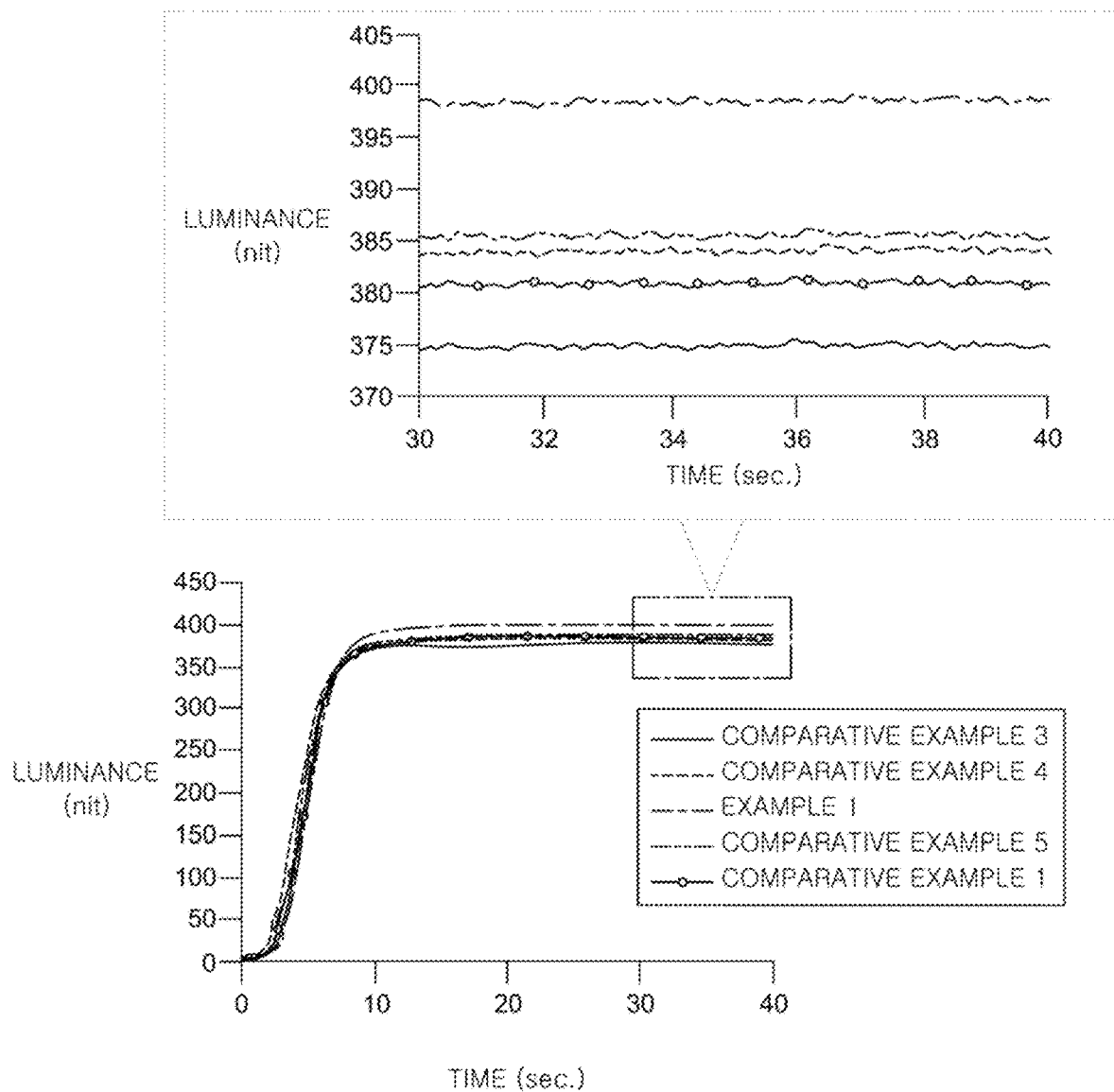
FIG. 10 is a graph illustrating a luminance measurement result of a display device including a viewing angle controlling film according to Example 1 and Comparative Examples 1, 3 to 5.

FIG. 10 is a graph illustrating a luminance measurement result of a display device including a viewing angle controlling film according to Example 1 and Comparative Examples 1, 3 to 5.

Figure 11:
FIG. 11 is a photograph illustrating whether there is a ghost mura phenomenon in a display device including a viewing angle controlling film according to Example 1 and Comparative Examples 1, 3 to 5.

FIG. 11 is a photograph illustrating whether there is a ghost mura phenomenon in a display device including a viewing angle controlling film according to Example 1 and Comparative Examples 1, 3 to 5.

TABLE 2

|  | Comp. Ex. 1 | Comp. Ex. 3 | Comp. Ex. 4 | Ex. 1 | Ex. 5 |
| --- | --- | --- | --- | --- | --- |
| Average particle size (nm) | — | 200 | 62 | 10.2 | 3.1 |
| Charge quantity (mV) | — | −16.2 | +3.2 | +9.6 | +16.8 |
| Refractive index | 1.437 | 1.501 | 1.499 | 1.497 | 1.498 |
| Settling speed (mm/day) | 0.0750 | 0.0387 | 0.0260 | 0.0148 | 0.0149 |
| Luminance (%) (Wide viewing angle mode) | 100 | 98.4 | 100.8 | 104.6 | 101.2 |
| Luminance (%) (Narrow viewing angle mode) | 0.90 | 1.10 | 1.00 | 0.90 | 1.00 |

Referring to Table 2, FIGS. 10 and 11 together, it is confirmed that the ink according to Example 1 has almost the same as the refractive index (1.498) of the transparent resin layer and thus the ghost mura phenomenon is hardly generated. The display device including the ink according to Example 1 has an excellent 30°-side surface luminance of 104.6% in the wide viewing angle mode and has a low 30°-side surface luminance of 0.90% in the narrow viewing angle mode. Therefore, it can be confirmed that the display device is well driven in the narrow viewing angle mode and the wide viewing angle mode.

In the meantime, in the ink of Comparative Example 3, an average particle size of the charged zinc oxide particles was 200 nm. In this case, it was confirmed that even though the zinc oxide particles were prepared under the same condition as Example 1, the particles were not charged with the positive charges, but were charged with the negative charges. As seen from Table 2 and FIG. 10, it is confirmed that the driving characteristic of the display device including the viewing angle controlling film is degraded. Further, referring to FIG. 11, it is confirmed that the ghost mura phenomenon is generated due to the refractive index difference of the transparent resin layer and the ink.

In the case of Comparative Example 4 in which the average particle size of the charged zinc oxide particles is 62 nm, the charge quantity is +3.2 mV and the particles are charged with charges opposite to the charged black particles. However, as seen from Table 10, it is confirmed that the charge quantity is not sufficiently high, so that the driving characteristic is worse than that of Example 1. It is further confirmed that the ghost mura phenomenon is generated as seen in FIG. 11.

Further, in the case of Comparative Example 5 in which the average particle size of the charged zinc oxide particles is 3.1 nm, it is confirmed that the (+) charge quantity is higher than that of Example 1 and as seen from FIG. 10, the driving characteristic is worse than that of Example 1. It is further confirmed that the ghost mura phenomenon is generated as seen in FIG. 11.

In the meantime, in the case of Comparative Example 1 in which the charged zinc oxide particles are not included, it is confirmed that the refractive index is the lowest and the particle settling speed is the highest. That is, the charged high refractive particles are added to increase the refractive index and suppress the particle settling phenomenon. Referring to Table 2, it is confirmed that in the ink according to Example 1, the particle settling speed is the slowest. From this, it is understood that according to Example 1, the particles in the ink maintain the stably dispersed state without being settled due to the gravity.

The exemplary aspects of the present disclosure can also be described as follows:

According to an aspect of the present disclosure, a viewing angle controlling film comprises a first base member; a first electrode disposed on the first base member; a transparent resin layer which is disposed on the first electrode and has a plurality of accommodating units; a second electrode disposed on the transparent resin layer; and a second base member disposed on the second electrode, wherein an ink including charged black particles, charged high refractive particles, and a solvent is accommodated in each of the plurality of accommodating units and the charged black particles are charged with a charge opposite to the charged high refractive particles.

Each of the plurality of accommodating units may be formed to be opposite to the second electrode, may be disposed to be spaced apart from each other along a first direction perpendicular to a thickness direction of the transparent resin layer, and may extend along a second direction perpendicular to the thickness direction and the first direction.

Each of the plurality of accommodating units may include a lower surface opposite to the first electrode, an upper surface opposite to the lower surface, and a connection unit connecting the lower surface and the upper surface.

The upper surface may be spaced apart from the second electrode and a distance from the upper surface to the second electrode may be 5 µm to 40 µm.

A distance from the lower surface to the upper surface may be 100 µm to 160 µm.

A width of the lower surface may be 25 µm to 50 µm and a width of the upper surface may be 5 µm to 15 µm.

The black particles may be one or more selected from the group consisting of carbon nano tubes and carbon blacks.

The charged black particles may be black particles surface-modified with one or more functional groups selected from the group consisting of a carboxylate group (—COO—), a sulfonate group (—SO3-), a sulfate group (SO42-), and a fluoride (F—) group.

A refractive index of the high refractive particle may be 1.7 to 3.0.

The high refractive particle may be one or more selected from the group consisting of titanium dioxide, zirconium dioxide, and zinc oxide.

The charged high refractive particle may be a high refractive particle surface-modified with an ammonium group.

An average particle size of the charged black particles may be 50 nm to 500 nm and an average particle size of the charged high refractive particles may be 5 nm to 30 nm.

A charge quantity of the charged black particle may be −25 mV to −50 mV and a charge quantity of the charged high refractive particle may be +5 mV to +11 mV.

The charged black particle may be included in an amount of 0.1 wt % to 3.5 wt % based on a total weight of the ink and the charged high refractive particle may be included in an amount of 0.1 wt % to 4 wt %.

The ink further may include one or more surfactants selected from the group consisting of tricresyl phosphate and tributyl phosphate and polyisobutylene succinimide amine.

The transparent resin layer may include an acrylic resin, a release agent, and a surfactant.

When a voltage is not applied to the first electrode and the second electrode, the charged black particles and the charged high refractive particles may be present to be uniformly dispersed inside each of the plurality of accommodating units and the viewing angle controlling film may operate in a narrow viewing angle mode and when a voltage is applied to the first electrode and the second electrode, the charged black particles may be aggregated toward the upper surface of the plurality of accommodating units, the charged high refractive particles may be dispersed in the plurality of accommodating units, and the viewing angle controlling film may operate in a wide viewing angle mode.

According to another aspect of the present disclosure, a display device comprises a display panel; and a viewing angle controlling film which is disposed above or below the display panel, wherein the viewing angle controlling film is that above mentioned.

The display panel may be a liquid crystal display panel and may further include a backlight unit disposed below the display panel, and the viewing angle controlling film may be disposed between the liquid crystal display panel and the backlight unit.

The display panel may be an organic light emitting display panel and the viewing angle controlling film may be disposed above the organic light emitting display panel.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A viewing angle controlling film, comprising:
a first base member;
a first electrode disposed on the first base member;
a transparent resin layer disposed on the first electrode and having a plurality of accommodating units;
a second electrode disposed on the transparent resin layer;
a second base member disposed on the second electrode;
wherein each of the plurality of accommodating units accommodates an ink including charged black particles, charged high refractive particles and a solvent, and
wherein the charged black particles are charged with a charge opposite to the charged high refractive particles,
wherein the high refractive particle has a refractive index of 1.7 to 3.0,
wherein, when a voltage is not applied to the first electrode and the second electrode, the charged black particles and the charged high refractive particles are present to be uniformly dispersed inside each of the plurality of accommodating units and the viewing angle controlling film operates in a narrow viewing angle mode, and
when a voltage is applied to the first electrode and the second electrode, the charged black particles are aggregated toward an upper surface of the plurality of accommodating units, the charged high refractive particles are dispersed in the plurality of accommodating units, and the viewing angle controlling film operates in a wide viewing angle mode.

2. The viewing angle controlling film according to claim 1, wherein each of the plurality of accommodating units is formed to face the second electrode, spaced apart from each other along a first direction perpendicular to a thickness direction of the transparent resin layer, and extends along a second direction perpendicular to the thickness direction and the first direction.

3. The viewing angle controlling film according to claim 1, wherein each of the plurality of accommodating units includes a lower surface faces the first electrode, an upper surface faces the lower surface, and a connection unit connecting the lower surface and the upper surface.

4. The viewing angle controlling film according to claim 3, wherein the upper surface is spaced apart from the second electrode by 5 μm to 40 μm.

5. The viewing angle controlling film according to claim 3, wherein the lower surface and the upper surface are spaced apart by 100 μm to 160 μm.

6. The viewing angle controlling film according to claim 3, wherein the lower surface has a width of 25 μm to 50 μm and the upper surface has a width of 5 μm to 15 μm.

7. The viewing angle controlling film according to claim 1, wherein the black particles include one of carbon nano tubes and carbon blacks.

8. The viewing angle controlling film according to claim 1, wherein the charged black particles are black particles surface-modified with one or more functional groups selected from the group consisting of a carboxylate group (—COO—), a sulfonate group (—SO3-), a sulfate group (SO42-), and a fluoride (F—) group.

9. The viewing angle controlling film according to claim 1, wherein the high refractive particle includes one of titanium dioxide, zirconium dioxide, and zinc oxide.

10. The viewing angle controlling film according to claim 1, wherein the charged high refractive particle is a high refractive particle surface-modified with an ammonium group.

11. The viewing angle controlling film according to claim 1, wherein the charged black particles have an average particle size of 50 nm to 500 nm and the charged high refractive particles have an average particle size of 5 nm to 30 nm.

12. The viewing angle controlling film according to claim 1, wherein the charged black particle has a charge quantity of −25 mV to −50 mV and the charged high refractive particle has a charge quantity of +5 mV to +11 mV.

13. The viewing angle controlling film according to claim 1, wherein the charged black particle is included in an amount of 0.1 wt % to 3.5 wt % based on a total weight of the ink and the charged high refractive particle is included in an amount of 0.1 wt % to 4 wt %.

14. The viewing angle controlling film according to claim 1, wherein the ink further includes one or more surfactants selected from the group consisting of tricresyl phosphate and tributyl phosphate and polyisobutylene succinimide amine.

15. The viewing angle controlling film according to claim 1, wherein the transparent resin layer includes an acrylic resin, a release agent, and a surfactant.

16. A display device, comprising:
a display panel; and
a viewing angle controlling film which is disposed above or below the display panel,
wherein the viewing angle controlling film includes:
a first base member;
a first electrode disposed on the first base member;
a transparent resin layer disposed on the first electrode and having a plurality of accommodating units;
a second electrode disposed on the transparent resin layer;
a second base member disposed on the second electrode;
wherein each of the plurality of accommodating units accommodates an ink including charged black particles, charged high refractive particles and a solvent, and
wherein the charged black particles are charged with a charge opposite to the charged high refractive particles,
wherein the high refractive particle has a refractive index of 1.7 to 3.0,
wherein, when a voltage is not applied to the first electrode and the second electrode, the charged black particles and the charged high refractive particles are present to be uniformly dispersed inside each of the plurality of accommodating units and the viewing angle controlling film operates in a narrow viewing angle mode, and
when a voltage is applied to the first electrode and the second electrode, the charged black particles are aggregated toward an upper surface of the plurality of accommodating units, the charged high refractive particles are dispersed in the plurality of accommodating units, and the viewing angle controlling film operates in a wide viewing angle mode.

17. The display device according to claim 16, wherein the display panel is a liquid crystal display panel and further includes a backlight unit disposed below the display panel, and the viewing angle controlling film is disposed between the liquid crystal display panel and the backlight unit.

18. The display device according to claim 16, wherein the display panel is an organic light emitting display panel and the viewing angle controlling film is disposed above the organic light emitting display panel.

* * * * *